(12) United States Patent
Cabanas-Holmen et al.

(10) Patent No.: US 9,013,219 B2
(45) Date of Patent: Apr. 21, 2015

(54) FILTERED RADIATION HARDENED FLIP FLOP WITH REDUCED POWER CONSUMPTION

(71) Applicant: The Boeing Company, Chicago, IL (US)

(72) Inventors: Manuel F. Cabanas-Holmen, McKenna, WA (US); Ethan Cannon, Sammamish, WA (US); Salim A. Rabaa, Lake Forest Park, WA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 14/024,310

(22) Filed: Sep. 11, 2013

(65) Prior Publication Data

US 2015/0070062 A1    Mar. 12, 2015

(51) Int. Cl.
*H03K 3/289* (2006.01)
*H03K 3/012* (2006.01)

(52) U.S. Cl.
CPC .................................. *H03K 3/012* (2013.01)

(58) Field of Classification Search
CPC ...... H03K 3/012; H03K 3/0375; H03K 3/289
USPC .................................. 327/199, 201, 202, 203
See application file for complete search history.

(56) References Cited

U.S. PATENT DOCUMENTS

| 5,831,463 | A  | * | 11/1998 | Sachdev ......................... 327/202 |
| 8,040,157 | B2 |   | 10/2011 | Farwell |
| 2006/0267653 | A1 |   | 11/2006 | Fulkerson |
| 2011/0102042 | A1 | * | 5/2011 | Cannon et al. ................ 327/199 |

* cited by examiner

*Primary Examiner* — John Poos
(74) *Attorney, Agent, or Firm* — Weiss & Moy, P.C.

(57) ABSTRACT

A flip flop circuit has a first stage and a second stage. The first stage and the second stage each have interleaved filters.

15 Claims, 6 Drawing Sheets

FILTERED RADIATION HARDENED FLIP FLOP WITH REDUCED POWER CONSUMPTION

BACKGROUND

Embodiments of this disclosure relate generally to electronic circuits, and more particularly, to a filtered low power, radiation hardened flip-flop circuit that mitigates sensitivity to single event upsets and single event transients (SETs).

Flip-flops may be used in logic pipelines in high performance digital Application Specific Integrated Circuits (ASIC), and mixed-signal Systems-on-Chip (SOC). As technologies scale, power density generally increases, making it necessary to develop new logic circuits that use less power. This trend is even more evident in ASICs and SOCs designed for space applications, where the spatial and temporal redundancy techniques used to mitigate Single Event Effects (SEE) caused by energetic particles may exacerbate power density concerns.

A single event in a flip-flop can flip the stored data, causing a Single Event Upset (SEU). Single events in logic gates create Single Event Transients (SETs) that can be captured by a flip-flop.

Spatial redundancy may be used to mitigate SEUs in flip-flops. Spatial redundancy is where two or more copies of the flip-flops may be used to reduce susceptibility to upsets in the flip flops. Transient filters may further be used to reduce or eliminate transients generated in the logic preceding the flip-flop and to keep the transients from being captured by the flip-flop. The addition of one or more redundant flip-flops and transient filters generally increases power and reduces performance significantly. The impact of redundancy depends on the flip-flop topology, while the impact of transient filters is similar for all flip-flop topologies.

A Dual Interlocked Storage Cell (DICE) flip flop with transient filters may be used to remove SETs at the flip-flop inputs DICE flip flops have improved. SEU tolerance by interlocking the storage nodes of two flip-flops. However, DICE flip flops generally use at least twice as much power as an unhardened flip-flop.

A Triple Modular Redundancy (TMR) flip flop also has improved SEU tolerance by triplicating the flip flop and using a majority voter to select the correct result. However, TMR flip flops generally use more than 3 times the power of the unhardened flip-flop.

Resistor-Capacitor (RC) filters may be used to mitigate SEUs in flip-flops. However, the resistors and capacitors generally require very large area in modern process technologies.

Therefore, it would be desirable to provide a system and method that overcomes the above identified problems, and others.

SUMMARY

According to an embodiment, a flip flop circuit has a first stage and a second stage. The first stage and the second stage each have interleaved filters.

According to another embodiment, a flip flop circuit has a first stage. The first stage has a first stage interleaved filter and a first stage feedback inverter coupled to a first stage interleaved filter input and to a first stage interleaved filter output. The flip flop circuit has a second stage. The second stage has a second stage interleaved filter and a second stage feedback inverter coupled to a second stage interleaved filter input and to a second stage interleaved filter output. A switching device is coupled between the first stage and the second stage.

According to yet another embodiment, a multi-stage flip flop circuit has a first stage interleaved filter coupled to an input of the multi-stage flip flop. A first stage feedback inverter is coupled to the input of the multi-stage flip flop and to a first stage interleaved filter output. A second stage interleaved filter is coupled to the first stage interleaved filter output. A second stage feedback inverter is coupled to the first stage interleaved filter output and to a second stage interleaved filter output. A switching device is coupled between the first stage and the second stage.

The features, functions, and advantages may be achieved independently in various embodiments of the disclosure or may be combined in yet other embodiments.

BRIEF DESCRIPTION OF THE DRAWINGS

Embodiments of the disclosure will become more fully understood from the detailed description and the accompanying drawings, wherein.

DETAILED DESCRIPTION

Figure 1:
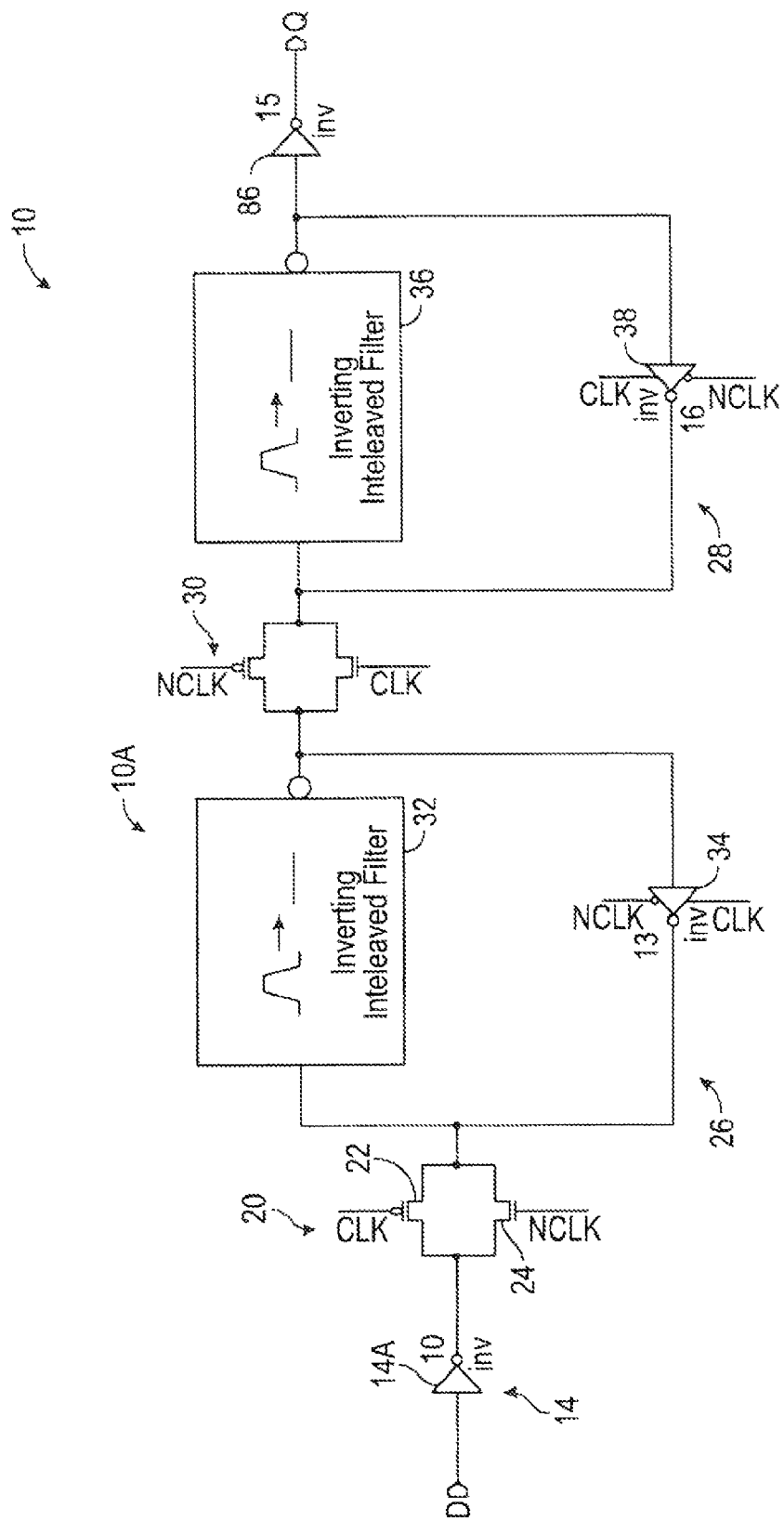
FIG. 1 is a block diagram of one embodiment of a radiation hardened flip-flop.
Figure 2:
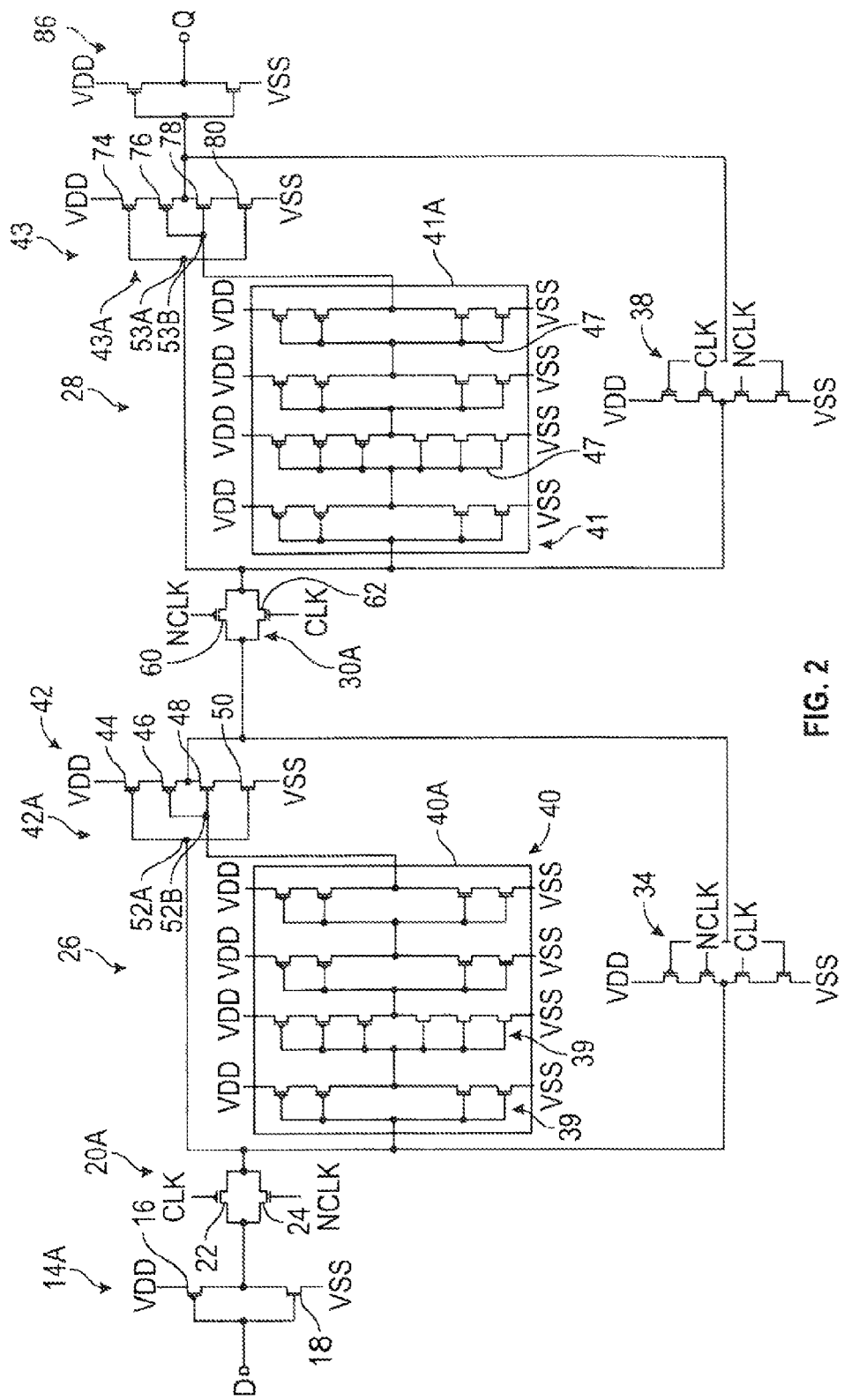
FIG. 2 is a simplified schematic of the radiation hardened flip-flop of FIG. 1.

Referring to FIGS. 1 and 2, a logic circuit 10 may be described. In the present embodiment, the logic circuit 10 may be configured as a flip flop 10A. The flip flop 10A may be designed to mitigate sensitivity to single event upsets and single event transients (SETs), with lower power consumption than other single event effects-mitigated logic circuits. The flip flop 10A treats the single event as an internal transient that needs to be filtered before it becomes an upset.

The flip flop 10A may have an input buffer 14. In the present embodiment, the input buffer 14 may be an inverter 14A. The inverter may be formed of a pair of transistors 16 and 18. The pair of transistors 16 and 18 may be complementary MOSFETS. As shown, the transistor 16 may be a P-type transistor such as a P-type MOSFET, while the transistor 18 may be an N-type transistor such as an N-type MOSFET. The transistor 16 may be coupled to a voltage supply VDD, while the transistor 18 may be coupled to a voltage supply VSS.

A switching device 20 may be coupled to an output of the inverter 14A. The switching device 20 may be used to pass on the output of the inverter 14A. In accordance with one embodiment, the switching device 20 may be a pass gate 20A. The pass gate 20A may be used to pass on the logic level output from the inverter 14A to a first stage 26 of the flip flop 10A. The pass gate 20A may be formed of a pair of transistors 22 and 24. As shown, the transistor 22 may be a P-type transistor such as a P-type MOSFET, while the transistor 24 may be an N-type transistor such as an N-type MOSFET. The transistor 22 may be coupled to a clock signal CLK, while the transistor 24 may be coupled to an inverted clock signal NCLK.

In the present embodiment, the flip flop 10A is a multi-stage flip flop having a first stage 26 and a second stage 28. A switching device 30 may be positioned between an output of the first stage 26 and an input of the second stage 28. In accordance with one embodiment, the switching device 30 is a pass gate 30A which may be used to pass the logic level output from the first stage 26 to the input of the second stage 28. The pass gate 30A may be formed of a pair of transistors 60 and 62. As shown, the transistor 60 may be a P-type transistor such as a P-type MOSFET, while the transistor 62 may be an N-type transistor such as an N-type MOSFET. The transistor 62 may be coupled to the clock signal CLK, while the transistor 60 may be coupled to the inverted clock signal NCLK.

In the present embodiment, the first stage 26 may have a first stage interleaved filter 32. A first stage feedback inverter 34 may be coupled between the output of the first stage interleaved filter 32 and the input of the first stage interleaved filter 32. Similarly, the second stage 28 may have a second stage interleaved filter 36. A second stage feedback inverter 38 may be coupled between the output of the second stage interleaved filter 36 and the input of the second stage interleaved filter 36.

The first stage interleaved filter 32 is configured to cut off transients coming from the logic preceding the flip-flop 10A when the inverted clock signal NCLK on the pass gate 20A is ON (at a high logic level), and any transients generated within the pass gate 20A, any transients generated within the first stage feedback inverter 34, and any transients generated within the first stage interleaved filter 32 when the inverted clock signal NCLK on the pass gate 20A is OFF. Likewise, the second stage interleaved filter 36 is configured to cut off transients generated within the first stage interleaved filter 32 when the clock signal CLK on the pass gate 30A is ON, and any transients generated within the pass gate 30A used to pass the logic level output from the first stage 26 to the input of the second stage 28, and any transients generated within the second stage feedback inverter 38, and any transients generated within the second stage interleaved filter 36 when the clock signal CLK on the pass gate 30A is OFF.

As shown in FIG. 2, the first stage interleaved filter 32 may be formed of a first stage delay circuit 40 and a first stage output buffer 42. In the present embodiment, the first stage delay circuit 40 may be a fixed delay circuit 40A. The fixed delay circuit 40A may be comprised of a plurality of series connected transistor delay elements 39 which provide a delay of a fixed duration. The duration of the fixed delay circuit 40A may be selected during the design phase of an Application Specific Integrated Circuit (ASIC). The delay time may be a function of process, voltage and temperature. For instance, if the ASIC is manufactured in a slow corner the delay may be greater, but commensurate with the type of transients generated by the logic circuits in the ASIC.

The first stage output buffer 42 may be a C-gate 42A. In the embodiment shown, the C-gate 42A may be comprised of two series PMOS transistors 44, 46 and two series NMOS transistors 48, 50. Each input 52A and 52B of the C-gate 42A controls the gate of one PMOS transistor 44 or 46 and one NMOS transistor 48 or 50. In the embodiment shown, the input 52A can control the gate of PMOS transistor 44 and the gate of NMOS transistor 50. The input 52B can control the gate of PMOS transistor 46 and the gate of NMOS transistor 48.

The output of the pass gate 20A may be sent to input 52A of the C-gate 42A and the fixed delay circuit 40A. The output of the fixed delay circuit 40A may be sent to the input 52B of the C-gate 42A. When the inputs 52A and 52B of the C-gate 42A match, the C-gate 42A may act as an inverter. When the inputs 52A and 52B of the C-gate 42A do not match, the C-gate 42A may not drive its output (high impedance state), and the output of the C-gate 42A may maintain its current value. The C-gate 42A is not sensitive to radiation events that affect a single node. However, a radiation event that causes a double-node strike that affects transistors 44 and 46, or transistors 48 and 50, may cause an SET at the output of the C-gate 42A.

The spacing needed to reduce double-node strikes of the C-gate 42A to an acceptable level may be attained by interleaving the PMOS transistors 44, 46 and the NMOS transistors 48, 50 in the C-gate 42A. The first stage delay circuit 40 may be placed between the interleaved PMOS transistors 44, 46, and between the interleaved NMOS transistors 48, 50 in the C-gate 42A, in order to achieve the desired node spacing without any wasted space.

The second stage interleaved filter 36 may be formed of a second stage delay circuit 41 and a second stage output buffer 43. In the present embodiment, the second stage delay circuit 41 may be fixed delay circuit 41A. The fixed delay circuit 41A may be comprised of a plurality of series connected transistor delay elements 47 which provide a delay of a fixed duration. The duration of the fixed delay circuit 41A may be selected during the design phase of an Application Specific Integrated Circuit (ASIC). The delay time may be a function of process, voltage and temperature. For instance, if the ASIC is manufactured in a slow corner the delay may be greater, but commensurate with the type of transients generated by the logic circuits in the ASIC.

The second stage output buffer 43 may be a C-gate 43A. In the embodiment shown, the C-gate 43A may be comprised of two series PMOS transistors 74, 76 and two series NMOS transistors 78, 80. Each input 53A and 53B of the C-gate 43A controls the gate of one PMOS transistor 74 or 76 and one NMOS transistor 78 or 80. In the embodiment shown, the input 53A can control the gate of PMOS transistor 74 and the gate of NMOS transistor 80. The input 53B can control the gate of PMOS transistor 76 and the gate of NMOS transistor 78.

The output of the pass gate 30A may be sent to input 53A of the C-gate 43A and the fixed delay circuit 41A. The output of the fixed delay circuit 41A may be sent to the input 53B of the C-gate 43A. When the inputs 53A and 53B of the C-gate 43A match, the C-gate 43A may act as an inverter. When the inputs 53A and 53B of the C-gate 43A do not match, the C-gate 43A may not drive its output (high impedance state), and the output of the C-gate 43A may maintain its current value. The output from the C-gate 43A may then be sent to an inverter 86.

The spacing needed to reduce double-node strikes of the C-gate 43A to an acceptable level may be attained by interleaving the PMOS transistors 74, 76 and the NMOS transistors 78, 80 in the C-gate 43A. The second stage delay circuit 41 may be placed between the interleaved PMOS transistors 74, 76, and between the interleaved NMOS transistors 78, 80 in the C-gate 43A, in order to achieve the desired node spacing without any wasted space.

The flip flop 10A of FIGS. 1 and 2 is highly tolerant to transients and upsets, utilizes the lowest energy, and puts the lowest load on the global clock tree. The setup time of the flip flop 10A is equivalent to that of a Dual Interlock Cell (DICE) flip-flop with a fixed-delay filter in the data input, but has a larger clock input to flip-flop output (CLK-to-Q) delay.

The flip flop 10A may be considered as a low power embodiment. The first stage interleaved filter 32 and the second stage interleaved filter 36 of the flip flop 10A may be configured to each have a fixed delay time. The configuration of the first stage and second stage interleaved filters 32 and 36 respectively may allow the flip flop 10A to utilize a lower amount of energy than the embodiments that will be described below. Thus, the flip flop 10A may be considered as a low power embodiment.

Figure 3:
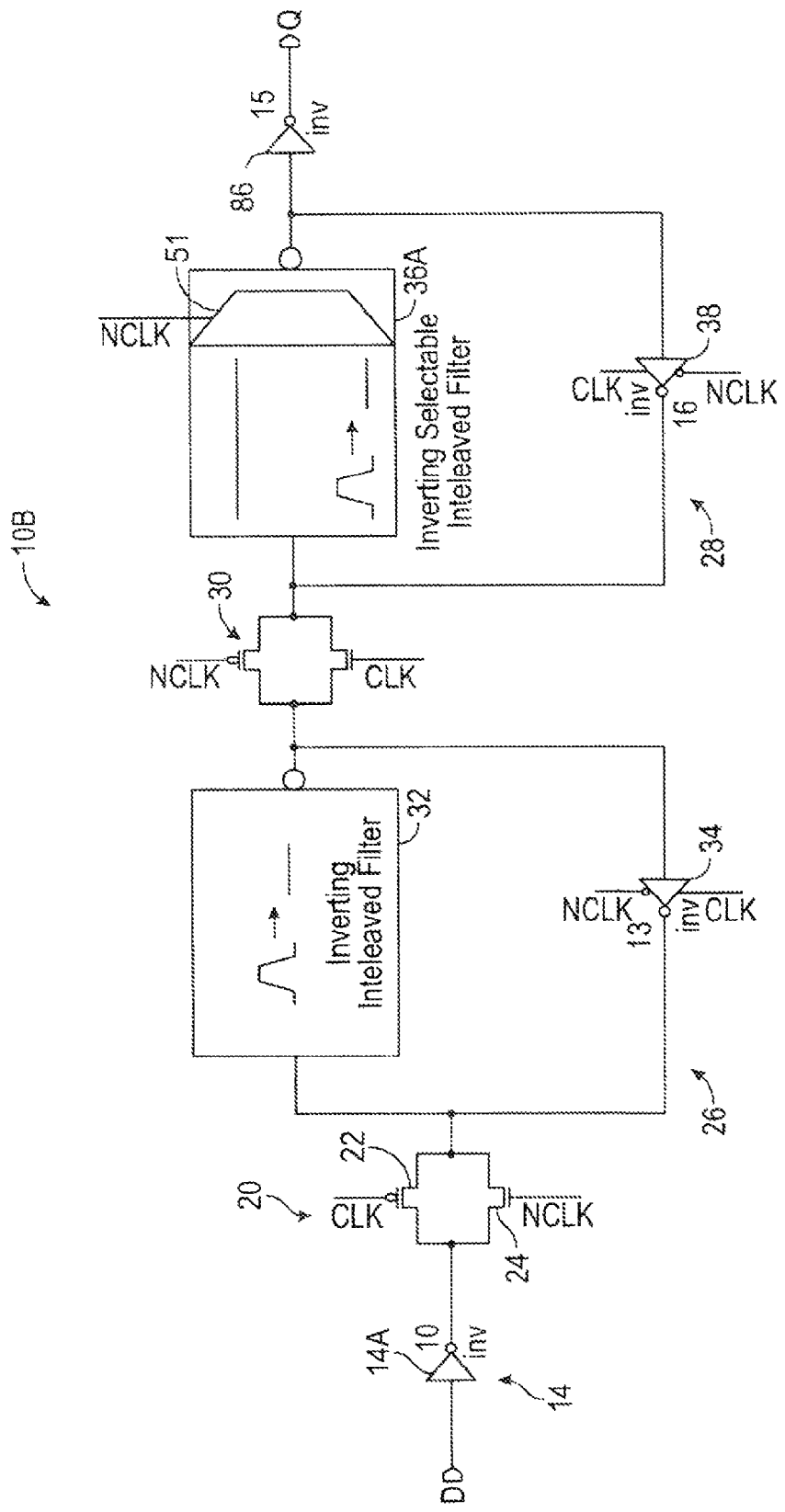
FIG. 3 is a block diagram of another embodiment of a radiation hardened flip-flop.
Figure 4:
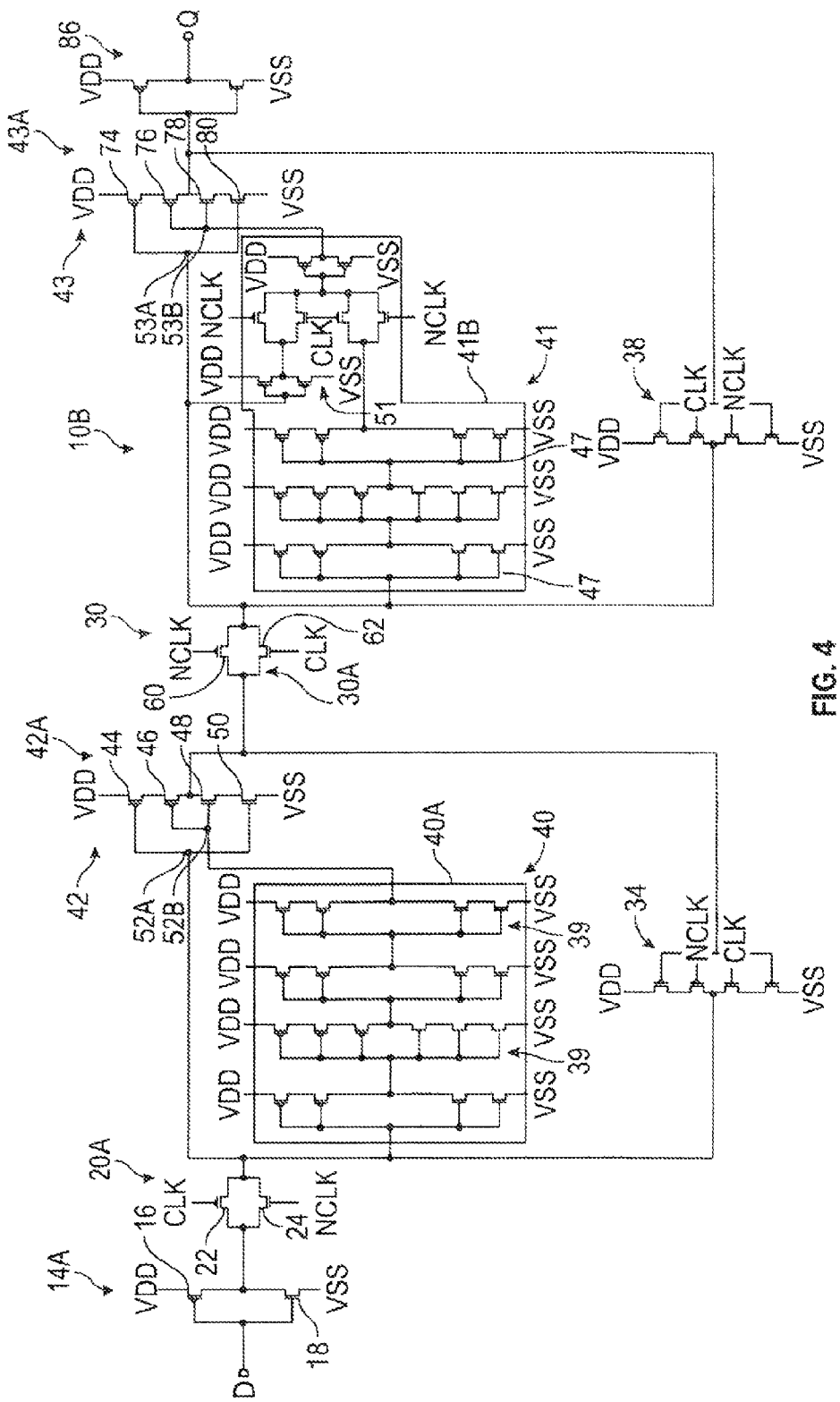
FIG. 4 is a simplified schematic of the radiation hardened flip-flop of FIG. 3.

Referring now to FIGS. 3 and 4, another embodiment of the flip flop 10B is shown. The flip flop 10B may have an input buffer 14. In the present embodiment, the input buffer 14 may be an inverter 14A. The inverter may be formed of a pair of transistors 16 and 18. The pair of transistors 16 and 18 may be complementary MOSFETS. As shown, the transistor 16 may be a P-type transistor such as a P-type MOSFET, while the transistor 18 may be an N-type transistor such as an N-type MOSFET. The transistor 16 may be coupled to a voltage supply VDD, while the transistor 18 may be coupled to a voltage supply VSS.

A switching device 20 may be coupled to an output of the inverter 14A. The switching device 20 may be used to pass on the output of the inverter 14A. In accordance with one embodiment, the switching device 20 may be a pass gate 20A. The pass gate 20A may be used to pass on the logic level output from the inverter 14A to a first stage 26 of the flip flop 10B. The Pass gate 20A may be formed of a pair of transistors 22 and 24. As shown, the transistor 22 may be a P-type transistor such as a P-type MOSFET, while the transistor 24 may be an N-type transistor such as an N-type MOSFET. The transistor 22 may be coupled to a clock signal CLK, while the transistor 24 may be coupled to an inverted clock signal NCLK.

In the present embodiment, the flip flop 10B is a multi-stage flip flop having a first stage 26 and a second stage 28. A switching device 30 may be positioned between an output of the first stage 26 and an input, of the second stage 28. In accordance with one embodiment, the switching device 30 is a pass gate 30A which may be used to pass the logic level output from the first stage 26 to the input of the second stage 28. The pass gate 30A may be formed of a pair of transistors 60 and 62. As shown, the transistor 60 may be a P-type transistor such as a P-type MOSFET, while the transistor 62 may be an N-type transistor such as an N-type MOSFET. The transistor 62 may be coupled to the clock signal CLK, while the transistor 60 may be coupled to the inverted clock signal NCLK.

In the present embodiment, the first stage 26 may have a first stage interleaved filter 32. A first stage feedback inverter 34 may be coupled between the output of the first stage interleaved filter 32 and the input of the first stage interleaved filter 32. The second stage 28 may have a second stage selectable interleaved filter 36A. A second stage feedback inverter 38 may be coupled between the output of the second stage selectable interleaved filter 36A and the input of the second stage selectable interleaved filter 36A.

The first stage interleaved filter 32 is configured to cut off transients coming from the logic preceding the flip-flop 10B when the inverted clock signal NCLK on the pass gate 20A is ON, and any transients generated within the pass gate 20A, any transients generated within the first stage feedback inverter 34, and any transients generated within the first stage interleaved filter 32 when the inverted clock signal NCLK on the pass gate 20A is OFF. Likewise, the second stage selectable interleaved filter 36A is configured to cut off transients generated within the first stage interleaved filter 32 when the clock signal CLK on the pass gate 30A is ON, and any transients generated within the pass gate 30A used to pass the logic level output from the first stage 26 to the input of the second stage 28, and any transients generated within the second stage feedback inverter 38, and any transients gener-ated within the second stage selectable interleaved filter 36A of the second stage 28 when the clock signal CLK on the pass gate 30A is OFF.

As shown in FIG. 4, the first stage interleaved filter 32 may be formed of a first stage delay circuit 40 and a first stage output buffer 42. In the present embodiment, the first stage delay circuit 40 may be fixed delay circuit 40A. The fixed delay circuit 40A may be comprised of a plurality of series connected transistor delay elements 39 which provide a delay of a fixed duration. The duration of the fixed delay circuit 40A may be selected during the design phase of an Application Specific Integrated Circuit (ASIC). The delay time may be a function of process, voltage and temperature. For instance, if the ASIC is manufactured in a slow corner the delay may be greater, but commensurate with the type of transients generated by the logic circuits in the ASIC.

The first stage output buffer 42 may be a C-gate 42A. In the embodiment shown, the C-gate 42A may be comprised of two series PMOS transistors 44, 46 and two series NMOS transistors 48, 50. Each input 52A and 52B of the C-gate 42A, controls the gate of one PMOS transistor 44 or 46 and one NMOS transistor 48 or 50. In the embodiment shown, the input 52A can control the gate of PMOS transistor 44 and the gate of NMOS transistor 50. The input 52B can control the gate of PMOS transistor 46 and the gate of NMOS transistor 48.

The output of the pass gate 20A may be sent to input 52A of the C-gate 42A and the fixed delay circuit 40A. The output of the fixed delay circuit 40A may be sent to the input 52B of the C-gate 42A. When the inputs 52A and 52B of the C-gate 42A match, the C-gate 22A may act as an inverter. When the inputs 52A and 52B of the C-gate 42A do not match, the C-gate 42A may not drive its output (high impedance state), and the output of the C-gate 42A may maintain its current value.

The spacing needed to reduce double-node strikes of the C-gate 42A to an acceptable level may be attained by interleaving the PMOS transistors 44, 46 and the NMOS transistors 48, 50 in the C-gate 42A. The first stage delay circuit 40 may be placed between the interleaved PMOS transistors 44, 46, and between the interleaved NMOS transistors 48, 50 in the C-gate 42A, in order to achieve the desired node spacing without any wasted space.

In FIGS. 3 and 4, the second stage selectable interleaved filter 36A may be formed of a second stage delay circuit 41 and a second stage output buffer 43. In this embodiment, the second stage delay circuit 41 is a selectable delay circuit 41B. The selectable delay circuit 41B may be comprised of a plurality of series connected transistor delay elements 47 each of which provide a delay of a fixed duration. Each transistor delay element 47 is similar to that shown for the transistor delay elements 39 of the fixed delay circuit 40A. The duration of each transistor delay element 47 may be selected during the design phase of an ASIC. The delay may be a function of process, voltage and temperature.

Each of the transistor delay elements 47 may be coupled to a multiplexer 51. The transistor delay elements 47 may be placed serially back to back with the output of each transistor delay element 47 coupled to an input of the multiplexer 51 and to the input of the subsequent transistor delay element 47. The output of the multiplexer 51 may be connected to the second input 53B of the C-gate 43A. One or more select signals may be sent to the multiplexer 51 and may be used to configure the selectable delay circuit 41B to a user selected, desired programmable time delay. The select signals may be used to send signals to the multiplexer 51 to select which outputs from the transistor delay elements 47 are sent to the second input 53B of the C-gate 43A. In the present embodiment, the select signals NCLK and CLK may be sent to the multiplexer 51 and used to configure the selectable delay circuit 41B. In another embodiment, user controlled select signals tied to input pins of the ASIC may be sent to the multiplexer 51 and used to configure the selectable delay circuit 41B.

The second stage output buffer 43 may be a C-gate 43A. In the embodiment shown, the C-gate 43A may be comprised of two series PMOS transistors 74, 76 and two series NMOS transistors 78, 80. Each input 53A and 53B of the C-gate 43A controls the gate of one PMOS transistor 74 or 76 and one NMOS transistor 78 or 80. In the embodiment shown, the input 53A can control the gate of PMOS transistor 74 and the gate of NMOS transistor 80. The input 53B can control the gate of PMOS transistor 76 and the gate of NMOS transistor 78.

The output of the pass gate 30A may be sent to input 53A of the C-gate 43A and the selectable delay circuit 41B. The output of the selectable delay circuit 41B may be sent to the input 53B of the C-gate 43A. When the inputs 53A and 53B of the C-gate 43A match, the C-gate 43A may act as an inverter. When the inputs 53A and 53B of the C-gate 43A do not match, the C-gate 43A may not drive its output (high impedance state), and the output of the C-gate 43A may maintain its current value. The output from the C-gate 43A may then be sent to an inverter 86.

The spacing needed to reduce double-node strikes of the C-gate 43A to an acceptable level may be attained by interleaving the PMOS transistors 74, 76 and the NMOS transistors 78, 80 in the C-gate 43A. The second stage delay circuit 41 may be placed between the interleaved PMOS transistors 74, 76, and between the interleaved NMOS transistors 78, 80 in the C-gate 43A, in order to achieve the desired node spacing without any wasted space.

In the flip flop 10B, the first stage 26 has a first stage interleaved filter 32 having a fixed delay that cuts off the majority of transients generated in the logic preceding the flip-flop 10B. The second stage 28 of the flip flop 10B has a second stage selectable interleaved filter 36A with multiple transistor delay elements 47 and the select input of the multiplexer 51 tied to the second stage latch clock NCLK. When the second stage latch clock gate is ON, the shortest delay is selected, resulting in a smaller CLK-to-Q delay, a critical flip-flop performance parameter. When the second stage latch clock gate is OFF, the larger delay is selected to provide greater immunity to upsets. The flip-flop 10B is highly tolerant to transients and upsets, utilizes only 6% more energy, and puts only 15% more load on the global clock tree than the low power version. Its setup time and CLK-to-Q delay are equivalent to that of a DICE flip-flop with a fixed-delay filter in the data input.

The flip flop 10B may be considered as a balanced embodiment. The flip flop 10B may be configured to have a first stage 26 and a second stage 28 wherein the first stage 26 has a first stage interleaved filter 32 and the second stage 28 has a second stage selectable interleaved filter 36A. In the balanced embodiment, the first stage interleaved filter 32 is configured to have a fixed delay time, while the second stage selectable interleaved filter 36A has a selectable delay time. The flip flop 10B may be considered as a balanced embodiment as the flip flop 10B allows one to select the delay time of the second stage selectable interleaved filter 36A. However, the ability to select the delay time for the second stage selectable interleaved filter 36A increases the power consumption of the flip flop 10B as compared to the flip flop 10A.

Figure 5:
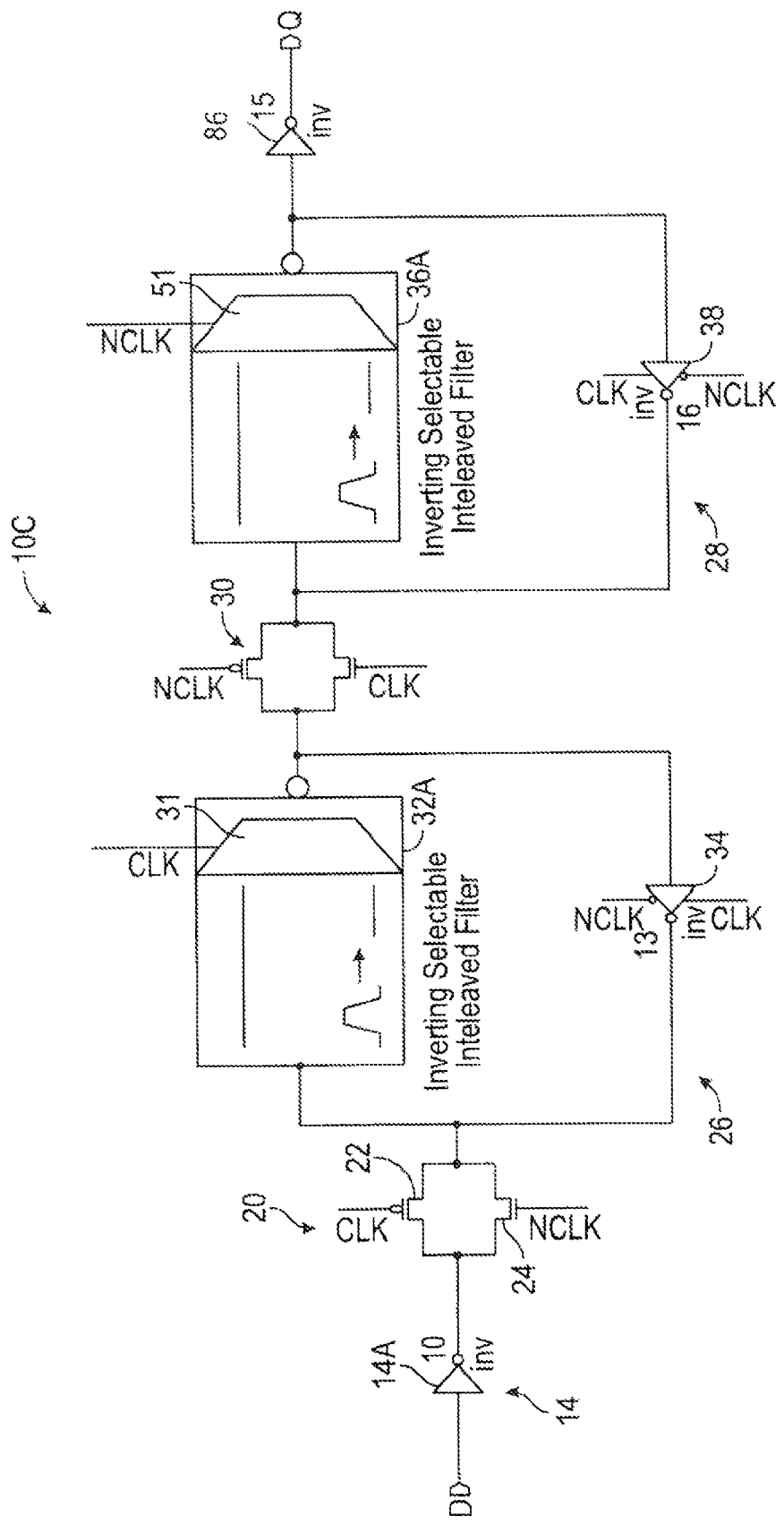
FIG. 5 is a block diagram of another embodiment of a radiation hardened flip-flop.
Figure 6:
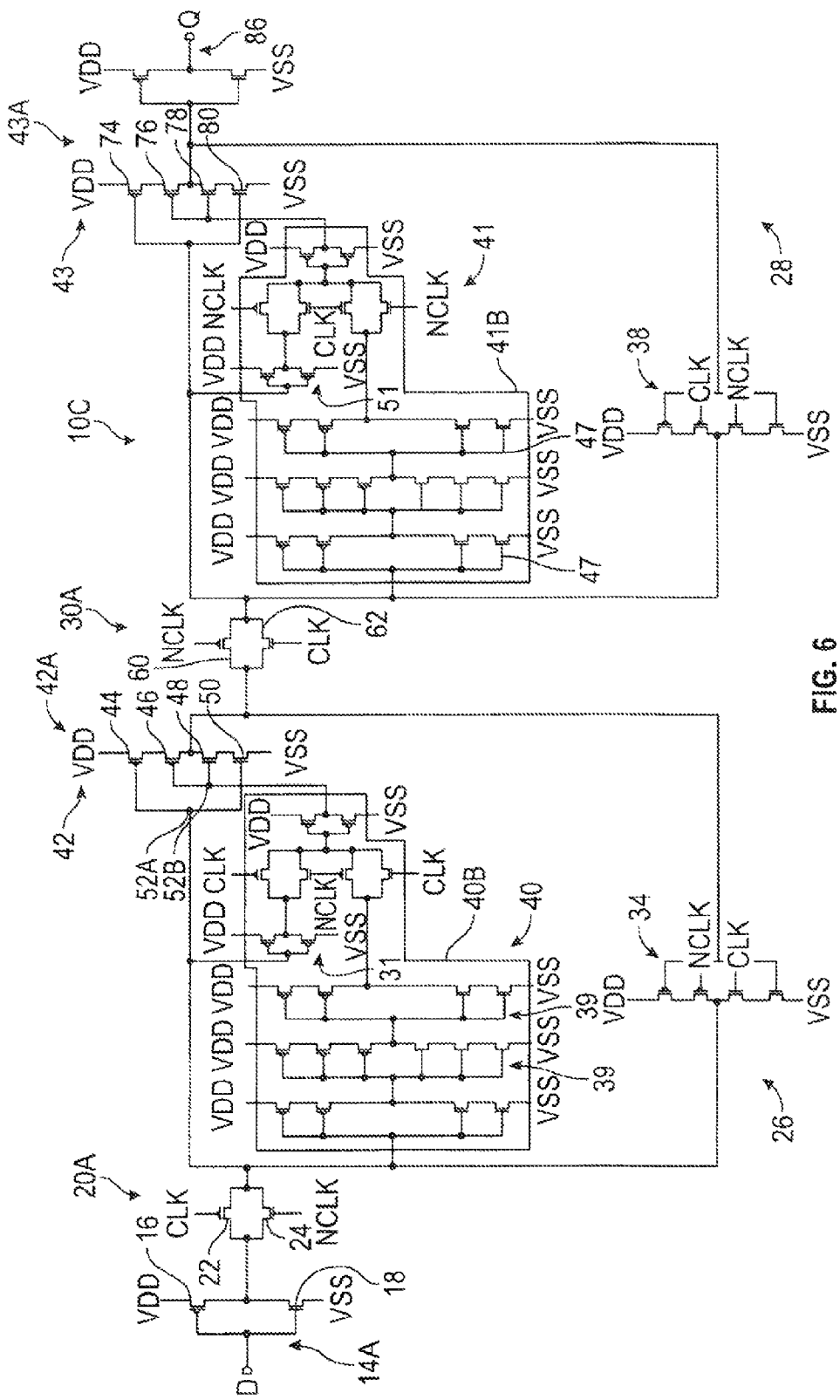
FIG. 6 is a simplified schematic of the radiation hardened flip-flop of FIG. 5.

Referring now to FIGS. 5-6, another implementation of the flip flop 10C is shown. The flip flop 10C may have an input buffer 14. In the present embodiment, the input buffer 14 may be an inverter 14A. The inverter 14A may be formed of a pair of transistors 16 and 18. The pair of transistors 16 and 18 may be complementary MOSFETS. As shown, the transistor 16 may be a P-type transistor such as a P-type MOSFET, while the transistor 18 may be an N-type transistor such as an N-type MOSFET. The transistor 16 may be coupled to a voltage supply VDD, while the transistor 18 may be coupled to a voltage supply VSS.

A switching device 20 may be coupled to an output of the inverter 14A. The switching device 20 may be used to pass on the output of the inverter 14A. In accordance with one embodiment, the switching device 20 may be a pass gate 20A. The pass gate 20A may be used to pass on the logic level output from the inverter 14A to a first stage 26 of the flip flop 10C. The Pass gate 20A may be formed of a pair of transistors 22 and 24. As shown, the transistor 22 may be a P-type transistor such as a P-type MOSFET, while the transistor 24 may be an N-type transistor such as an N-type MOSFET. The transistor 22 may be coupled to a clock signal CLK, while the transistor 24 may be coupled to an inverted clock signal NCLK.

In the present embodiment, the flip flop 10C is a multi-stage flip flop having a first stage 26 and a second stage 28. A switching device 30 may be positioned between an output of the first stage 26 and an input of the second stage 28. In accordance with one embodiment, the switching device 30 is a pass gate 30A, which may be used to pass the logic level output from the first stage 26 to the input of the second stage 28. The pass gate 30A may be formed of a pair of transistors 60 and 62. As shown, the transistor 60 may be a P-type transistor such as a P-type MOSFET, while the transistor 62 may be an N-type transistor such as an N-type MOSFET. The transistor 62 may be coupled to the clock signal CLK, while the transistor 60 may be coupled to the inverted clock signal NCLK.

In the present embodiment, the first stage 26 may have a first stage selectable interleaved filter 32A. A first stage feedback inverter 34 may be coupled between the output of the first stage selectable interleaved filter 32A and the input of the first stage selectable interleaved filter 32A. The second stage 28 may have a second stage selectable interleaved filter 36A. A second stage feedback inverter 38 may be coupled between the output of the second stage selectable interleaved filter 36A and the input of the second stage selectable interleaved filter 36A.

The first selectable interleaved filter 32A is configured to cut off transients coming from the logic preceding the flip-flop 10C when the inverted clock signal NCLK on the pass gate 20A is ON, and any transients generated within the pass gate 20A, any transients generated within the first stage feedback inverter 34, and any transients generated within the first stage selectable interleaved filter 32A when the inverted clock signal NCLK on the pass gate 20A is OFF. Likewise, the second stage selectable interleaved filter 36A is configured to cut off transients generated within the first stage interleaved filter 32A when the clock signal CLK on the pass gate 30A is ON, and any transients generated within the pass gate 30A used to pass the logic level output from the first stage 26 to the input of the second stage 28, and any transients generated within the second stage feedback inverter 38, and any transients generated within the second stage selectable interleaved filter 36A when the clock signal CLK on the pass gate 30A is OFF.

As shown in FIG. 6, the first stage selectable interleaved filter 32A may be formed of a selectable delay circuit 40B and a first stage output buffer 42. In the present embodiment, the selectable delay circuit 40B may be comprised of a plurality of series connected transistor delay elements 39. The duration of each transistor delay element 39 may be selected during the design phase of an ASIC. The delay may be a function of process, voltage and temperature.

Each of the transistor delay elements 39 may be coupled to a multiplexer 31. The transistor delay elements 39 may be placed serially back to back with the output of each transistor delay element 39 coupled to an input of the multiplexer 31 and to the input of the subsequent transistor delay element 39. The output of the multiplexer 31 may be connected to the second input 52B of the C-gate 42A. One or more select signals CLK may be sent to the multiplexer 31 and may be used to configure the selectable delay circuit 40B to a user selected, desired programmable time delay. The select signals CLK may be used to send signals to the multiplexer 31 to select which outputs from the transistor delay elements 39 are sent to the second input 52B of the C-gate 42A.

The first stage output buffer 42 may be a C-gate 42A. In the embodiment shown, the C-gate 42A may be comprised of two series PMOS transistors 44, 46 and two series NMOS transistors 48, 50. Each input 52A and 52B of the C-gate 42A controls the gate of one PMOS transistor 44 or 46 and one NMOS transistor 48 or 50. In the embodiment shown, the input 52A can control the gate of PMOS transistor 44 and the gate of NMOS transistor 50. The input 52B can control the gate of PMOS transistor 46 and the gate of NMOS transistor 48.

The output of the pass gate 20A may be sent to input 52A of the C-gate 42A and the selectable delay circuit 40. The output of the selectable delay circuit 40B may be sent to the input 52B of the C-gate 42A. When the inputs 52A and 52B of the C-gate 42A match, the C-gate 22A may act as an inverter. When the inputs 52A and 52B of the C-gate 42A do not match, the C-gate 42A may not drive its output (high impedance state), and the output of the C-gate 42A may maintain its current value.

The spacing needed to reduce double-node strikes of the C-gate 42A to an acceptable level may be attained by interleaving the PMOS transistors 44, 46 and the NMOS transistors 48, 50 in the C-gate 42A. The selectable delay circuit 40B may be placed between the interleaved PMOS transistors 44, 46, and between the interleaved NMOS transistors 48, 50 in the C-gate 42A, in order to achieve the desired node spacing without any wasted space.

In FIGS. 5 and 6, the second stage selectable interleaved filter 36A may be formed of a second stage delay circuit 41 and a second stage output buffer 43. In this embodiment, the second stage delay circuit 41 is a second stage selectable delay circuit 41B. The second stage selectable delay circuit 41E may be comprised of a plurality of transistor delay elements 47. Each transistor delay element 47 may be comprised of series connected transistors similar to that shown for the fixed delay circuit 41A. The duration of each transistor delay element 47 may be selected during the design phase of an ASIC. The delay may be a function of process, voltage and temperature.

Each of the transistor delay elements 47 may be coupled to a multiplexer 51. The transistor delay elements 47 may be placed serially back to back with the output of each transistor delay element 47 coupled to an input of the multiplexer 51 and to the input of the subsequent transistor delay element 47. The output of the multiplexer 51 may be connected to the second input 53B of the C-gate 43A. One or more select signals NCLK may be sent to the multiplexer 51 and may be used to configure the selectable delay circuit 41B to a user selected, desired programmable time delay. The select signals NCLK may be used to send signals to the multiplexer 51 to select which outputs from the fixed delay circuits 47 are sent to the second input 53B of the C-gate 43A.

The second stage output buffer 43 may be a C-gate 43A. In the embodiment shown, the C-gate 43A may be comprised of two series PMOS transistors 74, 76 and two series NMOS transistors 78, 80. Each input 53A and 53B of the C-gate 43A controls the gate of one PMOS transistor 74 or 76 and one NMOS transistor 78 or 80. In the embodiment shown, the input 53A can control the gate of PMOS transistor 74 and the gate of NMOS transistor 80. The input 53B can control the gate of PMOS transistor 76 and the gate of NMOS transistor 78.

The output of the pass gate 30A may be sent to input 53A of the C-gate 43A and the selectable delay circuit 41B. The output of the selectable delay circuit 41B may be sent to the input 53B of the C-gate 43A. When the inputs 53A and 53B of the C-gate 43A match, the C-gate 43A may act as an inverter. When the inputs 53A and 53B of the C-gate 43A do not match, the C-gate 43A may not drive its output (high impedance state), and the output of the C-gate 43A may maintain its current value. The output from the C-gate 43A may then be sent to an inverter 86.

The spacing needed to reduce double-node strikes the C-gate 43A to an acceptable level may be attained by interleaving the PMOS transistors 74, 76 and the NMOS transistors 78, 80 in the C-gate 43A. The selectable delay circuit 41B may be placed between the interleaved PMOS transistors 74, 76, and between the interleaved NMOS transistors 78, 80 in the C-gate 43A, in order to achieve the desired node spacing without any wasted space.

The flip flop 10C has a reduced setup time using a first stage selectable interleaved filter 32A with multiple delays and the multiplexer select input tied to the master latch clock for the first stage 26. When the master latch clock gate is ON, i.e., when the inverted clock signal NCLK is ON, the smaller delay is selected, reducing the flip-flop setup time trading off single event transient immunity for increased electrical performance. When the master latch clock gate is OFF, i.e., when the inverted clock signal NCLK is OFF, the larger delay is selected, preserving the flip-flop's robust SEU characteristics. The second stage 28 has the same design as in FIG. 3-4. This implementation would be useful in critical timing paths where a faster flip-flop is needed. The flip flop 10C is highly tolerant to upsets, but less tolerant to transients, utilizes 15% more energy, and puts 30% more load on the global clock tree than the low power version. Its setup time and CLK-to-Q delay are equivalent to that of a DICE flip-flop without a filter.

The flip flop 10B may be considered as a high performance embodiment. The flip flop 10C may be configured to have a first stage 26 having a first stage selectable interleaved filter 32A and a second stage 28 having a second stage selectable interleaved filter 36A. In the high performance embodiment, the first stage and second stage selectable interleaved filters 32A and 36A respectively are configured to have a selectable delay time. Thus, the delay time for both the first stage and second stage selectable interleaved filters 32A and 36A respectively may be selected based on a desired time delay. The flip flop 10C is a high performance embodiment that would be useful in critical timing paths where a faster flip-flop may be needed.

While embodiments of the disclosure have been described in terms of various specific embodiments, those skilled in the art will recognize that the embodiments of the disclosure may be practiced with modifications within the spirit and scope of the claims.

What is claimed is:

1. A flip flop circuit, comprising:
a first stage; and
a second stage,
wherein the first stage and the second stage each have interleaved filters, wherein the interleaved filter of the first stage comprises:
a first stage delay circuit; and
a first stage output buffer having a first input coupled to an input of the flip flop circuit and a second input coupled to an output of the first stage delay circuit.

2. The flip flop circuit in accordance with claim 1, further comprising a first stage feedback inverter coupled between an output of the first stage output buffer and the input of the flip flop.

3. The flip flop circuit in accordance with claim 1, wherein the first stage delay circuit has a fixed delay.

4. The flip flop circuit in accordance with claim 1, wherein the first stage delay circuit has a selectable delay.

5. The flip flop circuit in accordance with claim 1, wherein the interleaved filter of the second stage comprises:
a second stage delay circuit; and
a second stage output buffer having a first input coupled to an input of the second stage and a second input coupled to an output of the second stage delay circuit.

6. The flip flop circuit in accordance with claim 5, further comprising a second stage feedback inverter coupled between an output of the second stage output buffer and the input of the second stage.

7. The flip flop circuit in accordance with claim 5, wherein the second stage delay circuit has a fixed delay.

8. The flip flop circuit in accordance with claim 5, wherein the second stage delay circuit has a selectable delay.

9. A flip flop circuit comprising:
a first stage comprising:
a first stage interleaved filter having a first stage interleaved filter input and a first stage interleaved filter output; and
a first stage feedback inverter coupled to the first stage interleaved filter input and to the first stage interleaved filter output;
a second stage comprising:
a second stage interleaved filter having a second stage interleaved filter input and a second stage interleaved filter output; and
a second stage feedback inverter coupled to the second stage interleaved filter input and to the second stage interleaved filter output; and
a switching device coupled between the first stage and the second stage;
wherein the first stage interleaved filter comprises:
a first stage delay circuit, wherein the first stage delay circuit is a selectable delay; and
a first stage output buffer coupled to the first stage delay circuit, wherein the first stage output buffer comprises a plurality of transistors, wherein the plurality of transistors are interleaved.

10. The flip flop circuit in accordance with claim 9, wherein the second stage interleaved filter comprises:
a second stage delay circuit; and
a second stage output buffer coupled to the second stage delay circuit, wherein the second stage output buffer comprises a plurality of transistors, wherein the plurality of transistors are interleaved.

11. The flip flop circuit in accordance with claim 10, wherein the second stage delay circuit has a fixed delay.

12. The flip flop circuit in accordance with claim 10, wherein the second stage delay circuit has a selectable delay.

13. A multi-stage flip flop circuit comprising:
a first stage interleaved filter coupled to an input of the multi-stage flip flop;
a first stage feedback inverter coupled to the input of the multi-stage flip flop and to a first stage interleaved filter output;
a second stage interleaved filter coupled to the first stage interleaved filter output;
a second stage feedback inverter coupled to the first stage interleaved filter output and to a second stage interleaved filter output; and
a switching device coupled between the first stage and the second stage;
wherein the first stage interleaved filter has a delay circuit and the second stage interleaved filter has a selectable delay circuit.

14. The multi-stage flip flop circuit in accordance with claim 13, wherein the first stage interleaved filter delay circuit is a selectable delay circuit.

15. The multi-stage flip flop circuit in accordance with claim 13, wherein the first stage interleaved filter delay circuit is a fixed delay circuit.

* * * * *